United States Patent
Wang

(10) Patent No.: US 11,251,413 B2
(45) Date of Patent: Feb. 15, 2022

(54) METHOD FOR FABRICATING DISPLAY PANEL, DISPLAY PANEL AND DISPLAY DEVICE

(71) Applicant: BOE Technology Group Co., Ltd., Beijing (CN)

(72) Inventor: Tao Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/993,464

(22) Filed: Aug. 14, 2020

(65) Prior Publication Data
US 2021/0050561 A1    Feb. 18, 2021

(30) Foreign Application Priority Data
Aug. 16, 2019  (CN) .......................... 201910760351.5

(51) Int. Cl.
*H01L 21/00* (2006.01)
*H01L 51/56* (2006.01)
(Continued)

(52) U.S. Cl.
CPC .......... *H01L 51/56* (2013.01); *H01L 51/0096* (2013.01); *H01L 51/529* (2013.01); *H01L 51/5253* (2013.01)

(58) Field of Classification Search
CPC . H01L 51/56; H01L 51/0096; H01L 51/5253; H01L 51/529; H01L 2251/566; Y02E 10/549
(Continued)

(56) References Cited

U.S. PATENT DOCUMENTS

2005/0247936 A1* 11/2005 Bae .................... H01L 27/3253
                                                           257/59
2013/0299785 A1* 11/2013 Kim .................... H01L 51/5268
                                                           257/40
(Continued)

FOREIGN PATENT DOCUMENTS

CN    108417733 A    8/2018
CN    108598284 A    9/2018
(Continued)

OTHER PUBLICATIONS

Office Action for corresponding Chinese Application No. 201910760351.5 dated Apr. 6, 2021.

*Primary Examiner* — Caleb E Henry
(74) *Attorney, Agent, or Firm* — Aremt Fox LLP; Michael Fainberg

(57) ABSTRACT

Embodiments of the present disclosure disclose a method for fabricating a display panel, the display panel and a display device. The method for fabricating a display panel includes: forming a plurality of pixel units in a display area of a base substrate; forming at least one circle of blocking dam in a hollow area of the base substrate; forming a film packaging layer covering the display area and the hollow area, the hollow area being surrounded by the display area; forming an auxiliary heat radiation structure in the hollow area of the base substrate, the auxiliary heat radiation structure being located at a side, facing away from the base substrate, of the film packaging layer; cutting along a cutting line in the hollow area in a laser cutting process to remove the base substrate in the hollow area; and radiating heat by virtue of the auxiliary heat radiation structure.

11 Claims, 5 Drawing Sheets

(51) Int. Cl.
*H01L 51/00* (2006.01)
*H01L 51/52* (2006.01)

(58) Field of Classification Search
USPC .......................................................... 438/28
See application file for complete search history.

(56) References Cited

U.S. PATENT DOCUMENTS

| | | | |
|---|---|---|---|
| 2016/0368101 A1* | 12/2016 | Hsieh | B23K 26/702 |
| 2017/0278897 A1* | 9/2017 | Ao | H01L 33/641 |
| 2018/0031879 A1* | 2/2018 | Siddiqui | G02F 1/1339 |
| 2018/0159086 A1* | 6/2018 | Cho | H01L 51/5293 |
| 2020/0052244 A1 | 2/2020 | Gu et al. | |

FOREIGN PATENT DOCUMENTS

| | | |
|---|---|---|
| CN | 108615819 A | 10/2018 |
| CN | 208093561 U | 11/2018 |
| CN | 109065759 A | 12/2018 |
| CN | 109935730 A | 6/2019 |
| CN | 110048014 A | 7/2019 |
| JP | 2016058613 A | 4/2016 |

* cited by examiner

US 11,251,413 B2

METHOD FOR FABRICATING DISPLAY PANEL, DISPLAY PANEL AND DISPLAY DEVICE

CROSS-REFERENCE TO RELATED APPLICATION

This application is based on and claims priority under 35 U.S.C. 119 to Chinese Patent Application No. 201910760351.5, filed on Aug. 16, 2019, in the China National Intellectual Property Administration. The entire disclosure of the above application is incorporated herein by reference.

FIELD

The present disclosure relates to the technical field of display and in particular to a method for fabricating a display panel, the display panel and a display device.

BACKGROUND

With the progress of science and technology, full-screen equipment has gradually come into people's field of vision. In order to increase the screen-to-body ratio of the full-screen equipment, a display panel is generally punched to reserve positions for arranging cameras or some relevant sensors. During fabrication, generally, a light emitting device is fabricated on the display panel, then, a film packaging layer is fabricated for packaging, and then, the display panel is subjected to laser cutting so as to be punched. However, during punching by laser cutting, heat generated by laser cutting can not be diffused in time to result in thermal expansion and cold contraction, and thus, cracks are easy to generate on inorganic layers in the film packaging layer and diffuse inwards to result in reduction of trustworthiness of the display panel.

SUMMARY

Embodiments of the present disclosure provide a method for fabricating a display panel, including:
  forming a plurality of pixel units in a display area of a base substrate;
  forming at least one circle of blocking dam in a hollow area of the base substrate;
  forming a film packaging layer covering the display area and the hollow area the hollow area being surrounded by the display area;
  forming an auxiliary heat radiation structure in the hollow area of the base substrate, the auxiliary heat radiation structure being located at a side, facing away from the base substrate, of the film packaging layer;
  cutting along a cutting line in the hollow area in a laser cutting process to remove the base substrate in the hollow area; and
  radiating heat by virtue of the auxiliary heat radiation structure.

Optionally, the auxiliary heat radiation structure covers the cutting line.

Optionally, the auxiliary heat radiation structure completely covers the base substrate in an inner circumferential area of a blocking dam located on the innermost circumference.

Optionally, an orthographic projection of the auxiliary heat radiation structure on the base substrate is annular and covers the cutting line.

Optionally, the outer side of the orthographic projection of the auxiliary heat radiation structure on the base substrate is adjacent to the cutting line.

Optionally, the inner side of the orthographic projection of the auxiliary heat radiation structure on the base substrate is adjacent to the cutting line.

Optionally, a material of the auxiliary heat radiation structure includes a metal.

Optionally, the cutting line is located in the inner circumferential area of the blocking dam located on the innermost circumference; and
  the blocking dam includes an inverted trapezoid structure located at a side, facing the pixel units, of the base substrate, wherein a section, in a direction perpendicular to the base substrate, of the inverted trapezoid structure is an inverted trapezoid.

Optionally, the cutting line is adjacent to the inner side of an orthographic projection of the blocking dam located on the innermost circumference on the base substrate.

Embodiments of the present disclosure further provide a display panel fabricated by adopting the above-mentioned method.

Embodiments of the present disclosure further provide a display device including the above-mentioned display panel.

DETAILED DESCRIPTION OF THE EMBODIMENTS

In order to make objectives, technical solutions and advantages of the embodiments of the present disclosure clearer, the technical solutions in the embodiments of the present disclosure will be described clearly and completely below in conjunction with accompanying drawings in the embodiments of the present disclosure. Obviously, the described embodiments are a part of the embodiments of the present disclosure, not all the embodiments. Furthermore, the embodiments in the present disclosure and features in the embodiments may be combined with each other without conflicts. Based on the described embodiments of the present disclosure, all other embodiments obtained by those of ordinary skill in the art without creative work shall fall within the protection scope of the present disclosure.

Unless otherwise defined, technical terms or scientific terms used in the present disclosure shall be ordinary meanings as understood by those of ordinary skill in the art of the present disclosure. The words "first", "second" and similar terms used in the present disclosure do not denote any order, quantity or importance, but are merely used to distinguish different components. The word "including" or "includes" or the like means that the element or item preceding the word covers the element or object listed after the word and its equivalent, without excluding other elements or objects. The words "connection" or "connected" and the like are not limited to physical or mechanical connections, but may include electrical connections, whether direct or indirect.

It should be noted that the sizes and shapes of all patterns in the accompanying drawings do not reflect real scales, and are merely to illustrate the contents of the present disclosure. Furthermore, same or similar numerals throughout indicate same or similar elements or elements with same or similar functions.

Figure 1:
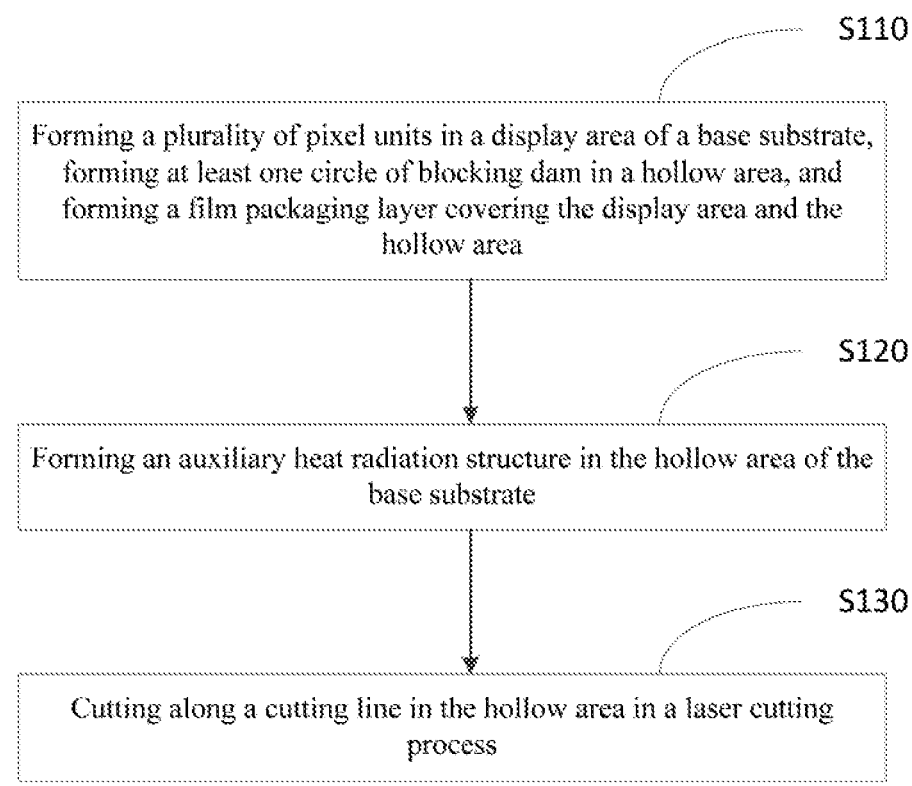
FIG. 1 is a flow diagram of a method for fabricating a display panel provided by an embodiment of the present disclosure.

Referring to FIG. 1, an embodiment of the present disclosure provides a method for fabricating a display panel, and the method may include the steps as follows.

S110, a plurality of pixel units are formed in a display area of a base substrate, and at least one circle of blocking dam is formed in a hollow area of the base substrate, and a film packaging layer covering the display area and a hollow area is formed, the display area surrounds the hollow area;

S120, an auxiliary heat radiation structure is formed in the hollow area of the base substrate, the auxiliary heat radiation structure is located at the side, departing from the base substrate, of the film packaging layer;

S130, cutting is performed along a cutting line in the hollow area in a laser cutting process to remove the base substrate in the hollow area, and heat is radiated by virtue of the auxiliary heat radiation structure.

Embodiments of the present disclosure provide a method for fabricating the display panel. Firstly, a plurality of pixel units are formed in a display area of a base substrate, at least one circle of blocking dam is formed in a hollow area of the base substrate, and a film packaging layer covering the display area and the hollow area is formed. Next, an auxiliary heat radiation structure is formed in the hollow area of the base substrate. Then, cutting is performed along a cutting line in the hollow area in a laser cutting process to remove the base substrate in the hollow area, and heat is radiated by virtue of the auxiliary heat radiation structure. Heat generated by laser cutting may be diffused by virtue of the auxiliary heat radiation structure in a process that the base substrate in the hollow area is removed by adopting the laser cutting process, thereby relieving the problem that cracks are generated on inorganic layers in a packaging film layer during laser cutting and reducing the problem that the generated cracks diffuse inwards.

Embodiment I

Figure 2:
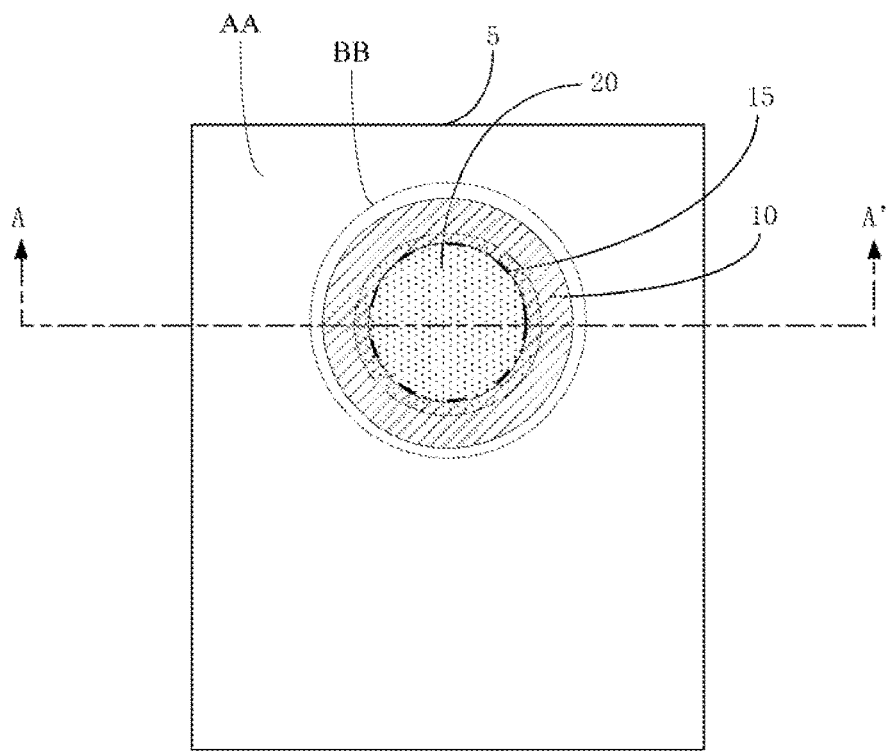
FIG. 2 is a schematic diagram of a vertical-view structure of a display panel provided by an embodiment of the present disclosure.
Figure 3:
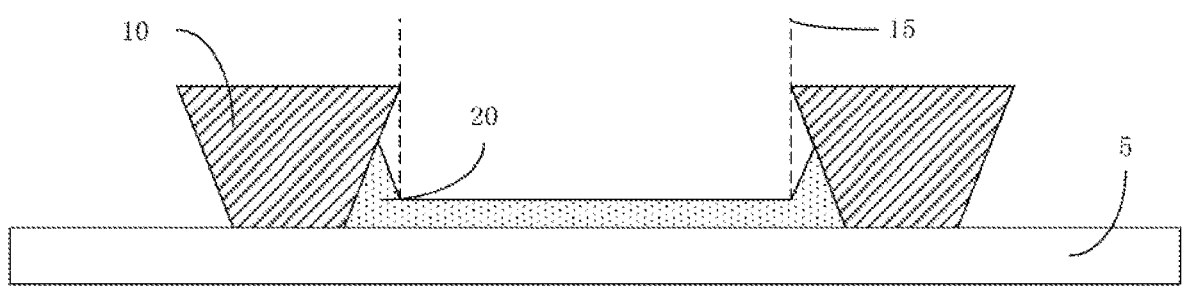
FIG. 3 is a schematic diagram of a sectional structure of the display panel as shown in FIG. 2 in an AA' direction.

During specific implementation, in an embodiment of the present disclosure, as shown in combination with FIG. 2 and FIG. 3, a base substrate 5 is provided with a display area AA and a hollow area BB, the display area AA surrounds the hollow area BB. During an actual application, a plurality of pixel units are formed in the display area AA. Each of the pixel units may include a plurality of sub-pixels. Exemplarily, each of the pixel units may include a red sub-pixel, a green sub-pixel and a blue sub-pixel, in this way, red, green and blue may be mixed so as to be displayed by a display panel. Or each of the pixel units may also include a red sub-pixel, a green sub-pixel, a blue sub-pixel and a white sub-pixel, in this way, red, green, blue and white may be mixed so as to be displayed by the display panel.

OLEDs (Organic light-emitting diodes) have the advantages such as low working voltage, high response speed, high light emitting efficiency, wide viewing angle and wide working temperature so as to be beneficial to designs of light weight, thinness, low power consumption and curved surface of the display panel. Generally, a driving circuit is adopted to drive the OLEDs to emit light. During specific implementation, in some embodiments of the present disclosure, the sub-pixels may include the OLEDs and the driving circuit for driving the OLEDs to emit light.

In order to prevent the OLEDs from being affected by water-dissolved oxygen, during specific implementation, in some embodiments of the present disclosure, the display panel may further include a film packaging layer located at the side, facing away from the base substrate, of the OLED. The film packaging layer may include a first inorganic film layer, an organic film layer and a second inorganic film layer which are arranged to be stacked. In order to block a film layer in the film packaging layer covering the hollow area BB, as shown in combination with FIG. 2 and FIG. 3, a circle of blocking dam 10 may be formed in the hollow area BB of the base substrate 5. Or two circles of blocking dams may be formed in the hollow area BB of the base substrate 5. Or three circles of blocking dams and even more circles of blocking dams may be formed in the hollow area BB of the base substrate 5, which may be designed and determined according to an actual application environment, but is not limited herein.

During specific implementation, in some embodiments of the present disclosure, as shown in combination with FIG. 2 and FIG. 3, the blocking dam 10 may include an inverted trapezoid structure located at the side, facing the pixel units, of the base substrate 5, a section, in a direction perpendicular to the base substrate 5, of the inverted trapezoid structure is an inverted trapezoid. In this way, a long enough distance may exist between the inorganic layers in the film packaging layer to guarantee the trustworthiness of the film packaging layer.

During specific implementation, in some embodiments of the present disclosure, as shown in combination with FIG. 2 and FIG. 3, a cutting line 15 may be located in an inner circumferential area of the blocking dam 10 located on the innermost circumference.

During specific implementation, in some embodiments of the present disclosure, as shown in combination with FIG. 2 and FIG. 3, the cutting line 15 may be adjacent to the inner side of an orthographic projection of the blocking dam 10 located on the innermost circumference on the base substrate 5. Of course, during an actual application, the cutting line 15 may not be completely adjacent to the inner side of the orthographic projection of the blocking dam 10 located on the innermost circumference on the base substrate 5 due to the restriction of technical conditions, and therefore, it is ok if only the above-mentioned requirements may be substantially met.

During specific implementation, in some embodiments of the present disclosure, as shown in combination with FIG. 2 and FIG. 3, an auxiliary heat radiation structure 20 may cover the cutting line 15. Optionally, the auxiliary heat radiation structure 20 completely covers the base substrate 5 located in an inner circumferential area of the blocking dam 10 located on the innermost circumference.

Optionally, a material of the auxiliary heat radiation structure 20 includes a metal. Exemplarily, the metal may be gold, silver, copper, aluminum and the like. During an actual application, a specific material of the auxiliary heat radiation structure 20 may be designed according to an actual application environment, but is not limited herein.

The method for fabricating the display panel is described below with the display panel as shown in FIG. 2 and FIG. 3 as an example, and the method for fabricating the display panel, provided by some embodiments of the present disclosure, may include the following steps.

(1) A plurality of pixel units are formed in a display area AA of a base substrate 5, a circle of blocking dam 10 is formed in a hollow area BB of the base substrate 5, and a packaging film layer covering the display area AA and the hollow area BB is formed.

A driving circuit and OLEDs are formed in pixel units. The fabrication process may be basically same as a fabrication process of an Array substrate in the related art, and the descriptions thereof are omitted herein.

A material of the base substrate 5 may include PI (Polyimide), PEN (Polyethylene naphthalate), PET (Polyethylene terephthalate) and the like, but is not limited to these.

The blocking dam 10 with an inverted trapezoid structure may be made from an inorganic material, or the blocking dam 10 with the inverted trapezoid structure may be obtained by virtue of different etching degrees of the inorganic insulating layers fabricated during the formation of the driving circuit.

(2) An auxiliary heat radiation structure 20 is formed in the hollow area BB of the base substrate 5, a method for forming the auxiliary heat radiation structure 20 may be evaporation, the auxiliary heat radiation structure 20 covers a cutting line 15 and completely covers the base substrate 5 in an inner circumferential area of the blocking dam 10 located on the innermost circumference.

(3) Cutting is performed along the cutting line 15 in the hollow area BB by adopting a laser cutting process, and heat generated by laser cutting is radiated by virtue of the auxiliary heat radiation structure 20, thereby relieving the problem that cracks are generated on inorganic layers in a packaging film layer during laser cutting and reducing the problem that the generated cracks diffuse inwards.

Embodiment II

The present embodiment is transformed with specific to parts of implementation modes in the embodiment I. Differences of the present embodiment and the embodiment I are only described below, but the descriptions of similarities thereof are omitted herein.

Figure 4:
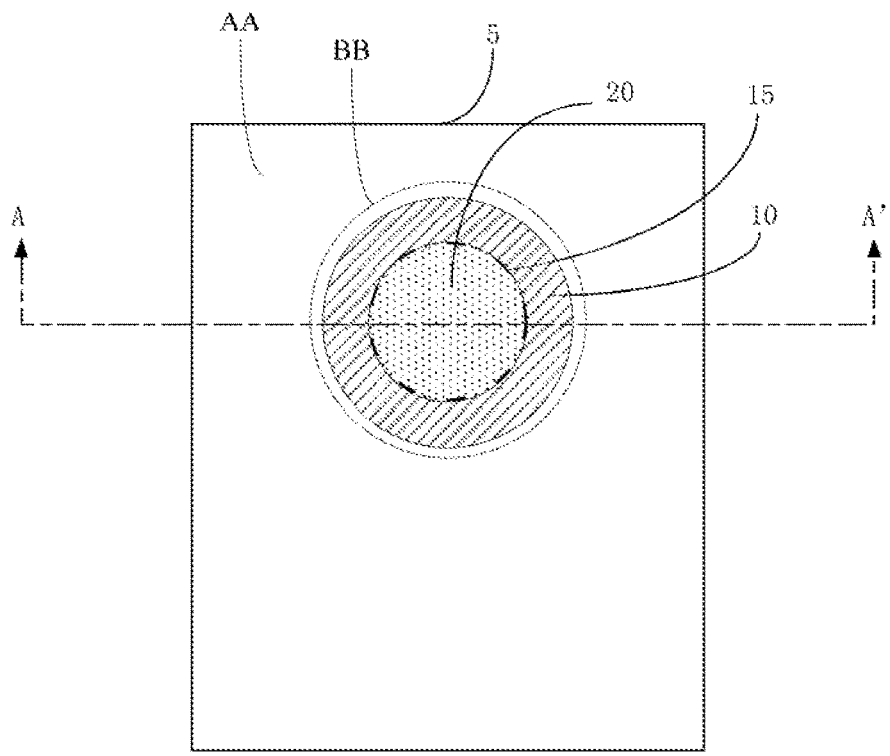
FIG. 4 is a schematic diagram of a vertical-view structure of another display panel provided by an embodiment of the present disclosure.
Figure 5:
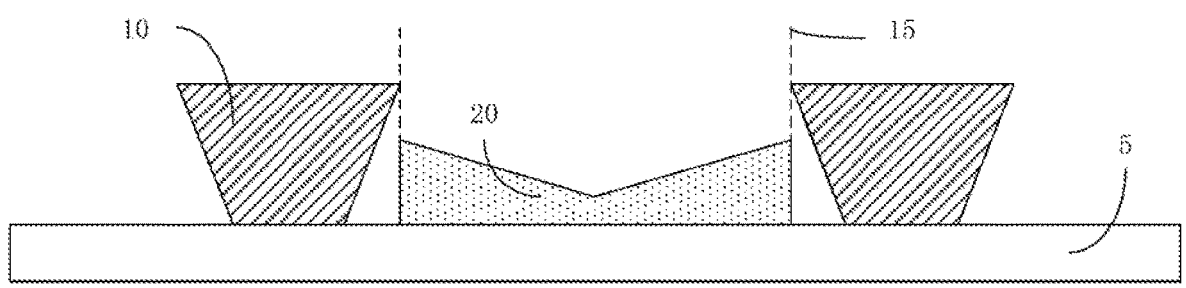
FIG. 5 is a schematic diagram of a sectional structure of the display panel as shown in FIG. 4 in an AA' direction.

As shown in FIG. 4 and FIG. 5, in the embodiment of the present disclosure, the outer side of an orthographic projection of an auxiliary heat radiation structure 20 on a base substrate 5 is adjacent to a cutting line 15. Heat generated by laser cutting is radiated by virtue of the auxiliary heat radiation structure 20 in the process of cutting along the cutting line in a hollow area BB by adopting a laser cutting process, thereby relieving the problem that cracks are generated on inorganic layers in a packaging film layer during laser cutting and reducing the problem that the generated cracks diffuse inwards.

A method for fabricating a display panel, as shown in combination with FIG. 4 and FIG. 5, may refer to the method in the above-mentioned embodiment, and the descriptions thereof are omitted herein.

Embodiment III

The present embodiment is transformed with specific to parts of implementation modes in the embodiment I. Differences of the present embodiment and the embodiment I are only described below, but the descriptions of similarities thereof are omitted herein.

Figure 6:
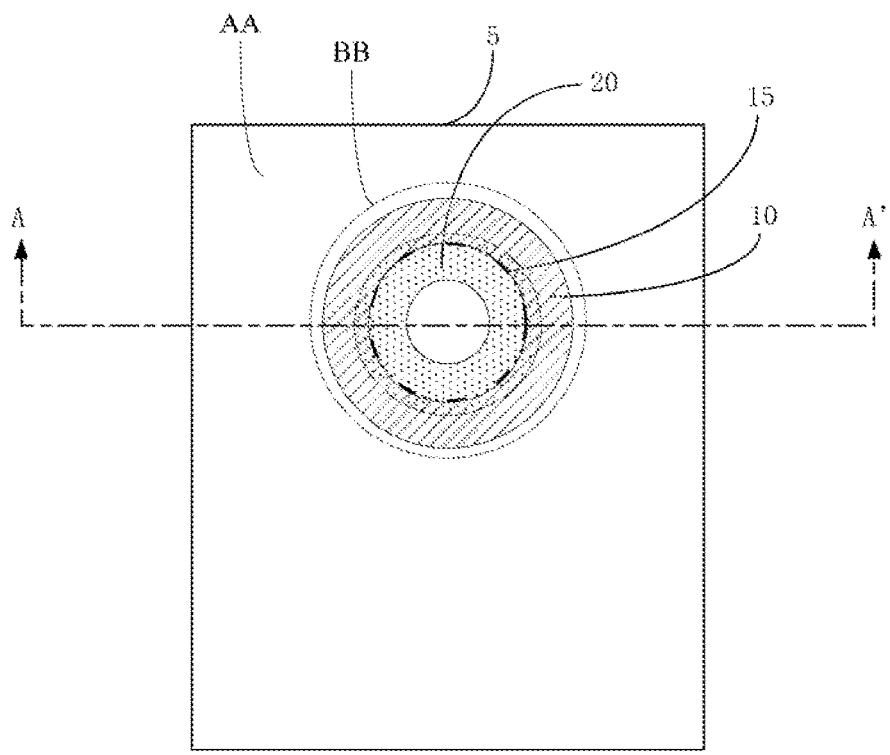
FIG. 6 is a schematic diagram of a vertical-view structure of another display panel provided by an embodiment of the present disclosure.
Figure 7:
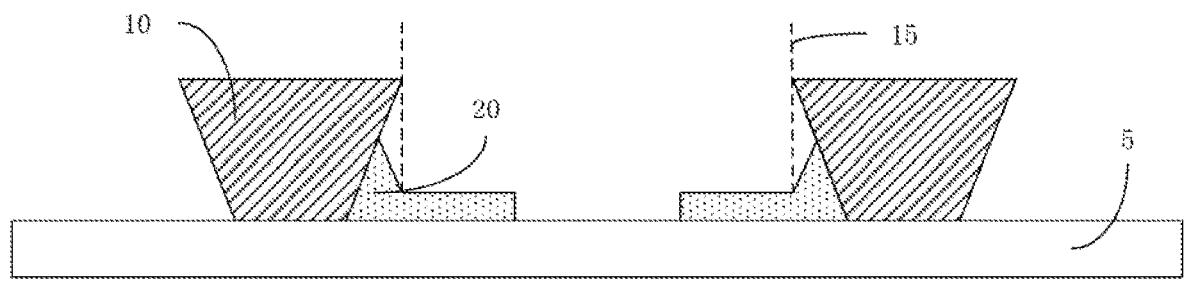
FIG. 7 is a schematic diagram of a sectional structure of the display panel as shown in FIG. 6 in an AA' direction.

As shown in FIG. 6 and FIG. 7, in the embodiment of the present disclosure, an orthographic projection of an auxiliary heat radiation structure 20 on a base substrate 5 is annular and covers a cutting line 15. Heat generated by laser cutting is radiated by virtue of the auxiliary heat radiation structure 20 in the process of cutting along the cutting line 15 in a hollow area BB by adopting a laser cutting process, thereby relieving the problem that cracks are generated on inorganic layers in a packaging film layer during laser cutting and reducing the problem that the generated cracks diffuse inwards.

A method for fabricating a display panel, as shown in combination with FIG. 6 and FIG. 7, may refer to the fabrication method in the above-mentioned embodiment, and the descriptions thereof are omitted herein.

Embodiment IV

The present embodiment is transformed with specific to parts of implementation modes in the embodiment I. Differences of the present embodiment and the embodiment I are only described below, but the descriptions of similarities thereof are omitted herein.

Figure 8:
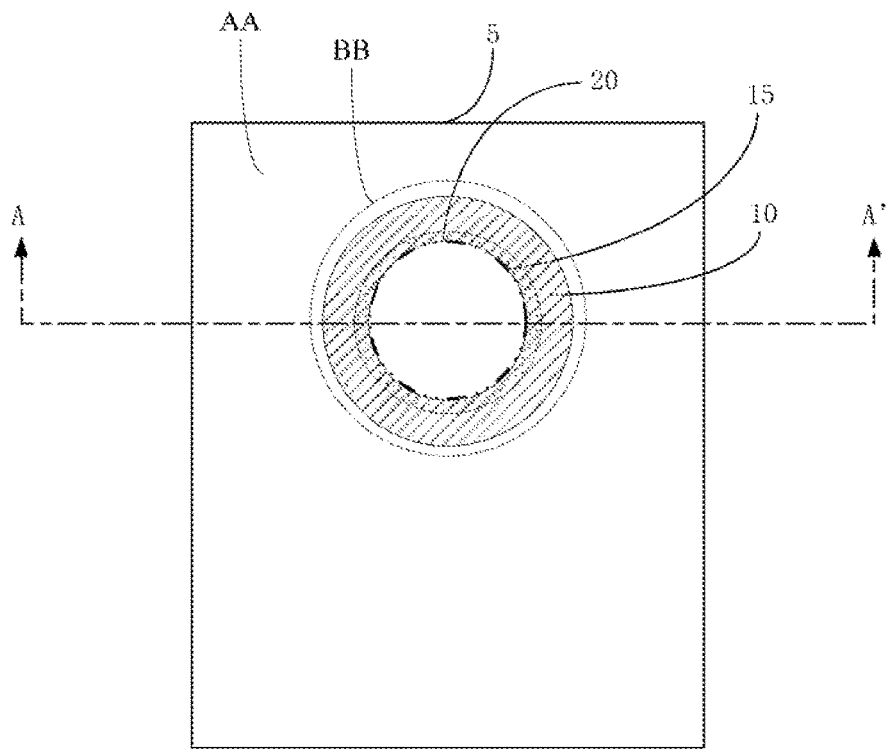
FIG. 8 is a schematic diagram of a vertical-view structure of another display panel provided by an embodiment of the present disclosure.
Figure 9:
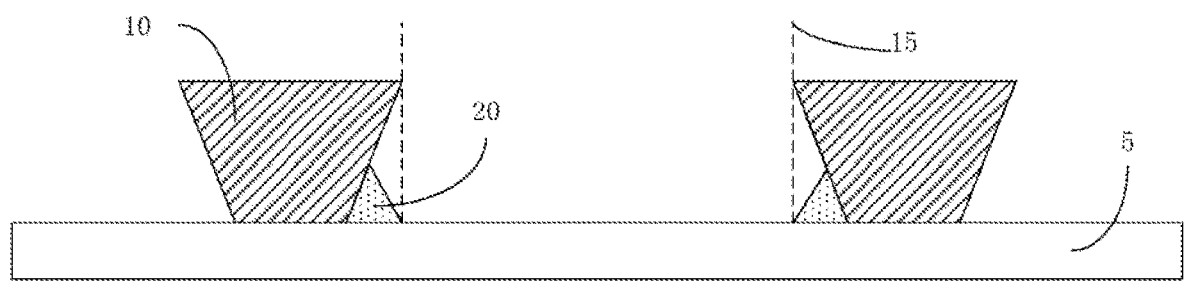
FIG. 9 is a schematic diagram of a sectional structure of the display panel as shown in FIG. 8 in an AA' direction.

As shown in FIG. 8 and FIG. 9, in the embodiment of the present disclosure, the inner side of an orthographic projection of an auxiliary heat radiation structure 20 on a base substrate 5 is adjacent to a cutting line 15. Heat generated by laser cutting is radiated by virtue of the auxiliary heat radiation structure 20 in the process of cutting along the cutting line 15 in a hollow area BB by adopting a laser cutting process, thereby relieving the problem that cracks are generated on inorganic layers in a packaging film layer during laser cutting and reducing the problem that the generated cracks diffuse inwards.

A method for fabricating a display panel, as shown in combination with FIG. 8 and FIG. 9, may refer to the fabrication method in the above-mentioned embodiment, and the descriptions thereof are omitted herein.

Based on the same inventive concept, embodiments of the present disclosure further provide a display panel which is fabricated by adopting any one of the above-mentioned methods. The problem solving principle of the display panel is similar to that of the above-mentioned method, and therefore, the implementation of the display panel may refer to that of the display panel obtained by the above-mentioned method, and the descriptions thereof are omitted herein.

Based on the same inventive concept, embodiments of the present disclosure further provide a display device including the above-mentioned display panel provided by the embodiment of the present disclosure. The problem solving principle of the display device is similar to that of the above-mentioned display panel, and therefore, the implementation of the display device may refer to that of the above-mentioned display panel, and the descriptions thereof are omitted herein.

During specific implementation, in embodiments of the present disclosure, the display device may be any one product or component with a display function, such as a mobile phone, a tablet personal computer, a television, a display, a notebook computer, a digital photo frame and a navigator. The ordinary skilled in the art should understand that other essential components of the display device are provided, the descriptions thereof are omitted herein, and they should not be regarded as limitations on the present disclosure.

The embodiments of the present disclosure provide the method for fabricating the display panel, the display panel and the display device. The method for fabricating the display panel includes: the plurality of pixel units are formed in the display area of the base substrate, and the at least one circle of blocking dam is formed in the hollow are of the base substrate; and the film packaging layer covering the display area and the hollow area are formed, the display area surrounds the hollow area; the auxiliary heat radiation structure is formed in the hollow area of the base substrate, the auxiliary heat radiation structure is located at the side, facing away from the base substrate, of the film packaging layer; cutting is performed along the cutting line in the hollow area by adopting the laser cutting process to remove the base substrate in the hollow area, and heat is radiated by virtue of the auxiliary heat radiation structure. Therefore, in the embodiments of the present disclosure, heat generated during laser cutting may be diffused in time due to the formation of the auxiliary heat radiation structure, thereby relieving the problem that cracks are easy to generate on the inorganic layers of the packaging film and diffuse inwards and improving the trustworthiness of the display panel.

Obviously, those skilled in the art can make various alterations and transformations on the present disclosure without departing from the spirit and scope of the present disclosure. In this way, if these alterations and transformations of the present disclosure fall within the scope of the claims of the present disclosure and equivalent technologies of the claims, the present disclosure is also intended to include these alterations and transformations.

What is claimed is:

1. A method for fabricating a display panel, comprising
forming a plurality of pixel units in a display area of a base substrate;
forming at least one circle of blocking dam in a hollow area of the base substrate;
forming a film packaging layer covering the display area and the hollow area; the hollow area being surrounded by the display area;
forming an auxiliary heat radiation structure in the hollow area of the base substrate, the auxiliary heat radiation structure being located at a side, facing away from the base substrate, of the film packaging layer;
cutting along a cutting line in the hollow area in a laser cutting process to remove the base substrate in the hollow area; and
radiating heat by virtue of the auxiliary heat radiation structure.

2. The method for fabricating the display panel according to claim 1, wherein the auxiliary heat radiation structure covers the cutting line.

3. The method for fabricating the display panel according to claim 2, wherein the auxiliary heat radiation structure completely covers the base substrate in an inner circumferential area of a blocking dam located on an innermost circumference.

4. The method for fabricating the display panel according to claim 2, wherein an orthographic projection of the auxiliary heat radiation structure on the base substrate is annular and covers the cutting line.

5. The method for fabricating the display panel according to claim 1, wherein an outer side of an orthographic projection of the auxiliary heat radiation structure on the base substrate is adjacent to the cutting line.

6. The method for fabricating the display panel according to claim 1, wherein an inner side of an orthographic projection of the auxiliary heat radiation structure on the base substrate is adjacent to the cutting line.

7. The method for fabricating the display panel according to claim 1, wherein a material of the auxiliary heat radiation structure comprises a metal.

8. The method for fabricating the display panel according to claim 1, wherein the cutting line is located in an inner circumferential area of a blocking dam located on an innermost circumference; and
the blocking dam comprises an inverted trapezoid structure located at a side, facing the pixel units, of the base substrate, wherein a section, in a direction perpendicular to the base substrate, of the inverted trapezoid structure is an inverted trapezoid.

9. The method for fabricating the display panel according to claim 8, wherein the cutting line is adjacent to an inner side of an orthographic projection of the blocking dam located on the innermost circumference on the base substrate.

10. A display panel, wherein the display panel is fabricated by adopting the method according to claim 1.

11. A display device, comprising the display panel according to claim 10.

* * * * *